United States Patent [19]

Enomoto et al.

[11] Patent Number: 5,412,002

[45] Date of Patent: May 2, 1995

[54] COMPOSITION OF GLYCIDYLATED PHENOL/VINYLCYCLOHEXENE OR VINYLNORBORNENE RESIN

[75] Inventors: Masami Enomoto; Susumu Kubota; Hitoshi Yuasa; Fumiaki Oshimi; Yutaka Otsuki, all of Yokohama, Japan

[73] Assignee: Nippon Oil Co., Ltd., Tokyo, Japan

[21] Appl. No.: 988,225

[22] Filed: Dec. 9, 1992

[30] Foreign Application Priority Data

Dec. 11, 1991 [JP] Japan .................. 3-327830

[51] Int. Cl.⁶ .............. C08K 3/36; C08L 63/00; C08G 59/04
[52] U.S. Cl. ..................... 523/466; 523/427; 523/429; 523/434; 525/118; 525/485; 525/486; 525/523; 525/524; 525/529; 528/97; 528/98; 522/37; 522/39; 522/40; 522/43; 522/55; 522/70
[58] Field of Search ............ 523/427, 429, 434, 466; 525/118, 485, 486, 523, 524, 529; 528/97, 98, 205

[56] References Cited

U.S. PATENT DOCUMENTS 4,927,905  5/1990  Bogan ................... 528/205
4,954,553  9/1990  Johnson et al. ............ 523/334

Primary Examiner—Robert E. Sellers
Attorney, Agent, or Firm—Darby & Darby

[57] ABSTRACT

An epoxy resin composition contains an epoxy resin represented by the formula (I) and a curing accelerator:

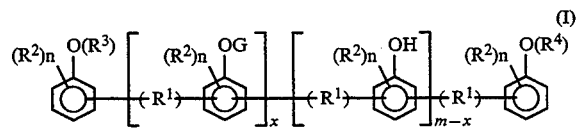

wherein $R^1$ stands for

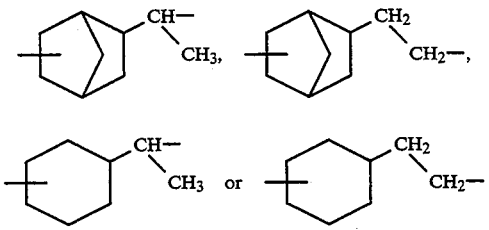

where G stands for a glycidyl group, $R^2$ stands for an alkyl group having 1 to 4 carbon atoms, $R^3$ and $R^4$ stand for the same or different groups and each denote a hydrogen atom or a glycidyl group, m and x each denote an integer of 0 to 10, n denotes an integer of 0 to 2, provided that $m \geq x$ and, if $m=0$, then $x=0$, in which case at least one of $R^3$ and $R^4$ denotes a glycidyl group on the condition that when $m \geq 1$ and $m > x$, $R^1$ may each stand for different groups.

12 Claims, No Drawings

COMPOSITION OF GLYCIDYLATED PHENOL/VINYLCYCLOHEXENE OR VINYLNORBORNENE RESIN

BACKGROUND OF THE INVENTION

This invention relates to an epoxy resin composition having superior moisture proofness and long-term stability, an epoxy resin composition for encapsulation, an epoxy resin composition for a laminated plate, and an epoxy resin composition for a solder resist.

Recently, in keeping up with rapid progress in the scientific technology centered around the electronic industry, a demand on a variety of electrical equipments and the material therefor is becoming more and more stringent. Above all, the progress in the semiconductor-related technology is outstanding, such that the integration degree of semiconductor memories is becoming higher and, in keeping pace therewith, there is a marked tendency towards finer interconnection and larger chip size. On the other hand, with the improved integration degree of semiconductor memories, surface mounting is adopted as a mounting method in preference to through-hole mounting. However, in line automation of surface mounting, a problem is raised in that upon soldering lead wires, a semiconductor package undergoes acute changes in temperature, as a result of which the resin molded part is cracked or the interface between the lead wire and the resin is deteriorated to lower moisture proofness.

For overcoming the above inconvenience, a variety of resin compositions for semiconductor encapsulation for relieving thermal impact on immersion of a semiconductor package in a soldering bath have been proposed. For example, resin compositions admixed with silicon compounds or thermoplastic oligomers or silicon-modified resin compositions have been proposed. However, with these compositions, molded products are cracked after immersion in a soldering bath, such that reliable resin compositions for semiconductor encapsulation have not been realized.

As for phenol resins employed as curing agents for the epoxy resins as main components of the resin composition for semiconductor encapsulation, dicyclopentadiene-modified phenol resins have been proposed as heat-resistant phenol resins having excellent moisture proofness in preference to customary novolak phenol resin or novolak cresol resin (Japanese Laid-open Patent Application No.63-110213). However, these dicyclopentadiene-modified phenol resins are low in reactivity and have higher softening points, while being inferior in moldability, so that it is not possible to prevent cracking on immersion in the soldering bath completely.

Novolak epoxy resins are mainly employed as the epoxy resin used for a resin composition for semiconductor encapsulation. Recently, for overcoming the above-mentioned problems, an epoxy resin produced by diglycidylating a bivalent phenol compound such as bisphenol compound or bishydroxy naphthalene, has been proposed and employed. Although the epoxy resin has a high glass transition temperature Tg of the cured product and the amount of addition of inorganic fillers can be increased, despite its low molecular weight, the produced cured product is not satisfactory in flexibility, while being inferior in moisture proofness.

In the field of high-speed electronic equipment, in keeping pace with the tendency towards high density of electronic elements, high signal rate and high frequency, problems have been raised in connection with delay in signal transmission in the materials of high-speed electronic equipments or heat evolution in various devices. Since the delay time in signal transmission is increased in proportion to the root of dielectric constant of the printed interconnection plate material, a demand has been raised for materials having a low dielectric constant. However, an epoxy resin laminated plate based on glass cloth extensively used in general as printed interconnection plate material has a dielectric constant as high as 4.5 to 5.0 such that if such laminated plate is used as a material for high-speed electronic equipment or high-frequency equipment, signal transmission with a high enough rate cannot be achieved Although a laminated plate of polyethylene, polytetrafluoroethylene, polyphenylene oxide or polysulfone, has been developed for lowering the dielectric constant, a problem is presented in that since the resin used in the laminated plate is a thermoplastic resin, it is inferior in strength or thermal resistance on soldering. On the other hand, epoxy resins consisting mainly of novolak epoxy resin and admixed with bromated epoxy resins with a view to retardation of combustion have been employed as the epoxy resins used in general in epoxy resin laminated plates. However, since the resin owes its dielectric properties in a majority of cases to the structure of the epoxy resins employed, a demand has been raised for an epoxy resin which may be used as a material for printed interconnection circuit for a high frequency equipment and a high-speed electronic equipment in place of the novolak epoxy resin, and which is superior in dielectric properties. However, such resin has not been developed to data.

On the other hand, a solder resist is a material which is applied at the time of soldering an electronic component to a printed interconnection circuit to sites other than those intended for soldering for the purpose of preventing the solder from becoming affixed or for protecting the interconnection circuit. Consequently, thermal resistance on soldering, resistance to water-soluble fluxes, electrical insulating properties, tight bonding and excellent properties on pressure cooker tests (PCT) are demanded of the solder resist. Besides, the solder resist is directly used in a majority of cases as a plating resist, in which case resistance to alkali, resistance to acid and resistance to plating are demanded of the solder resist.

Various types of the solder resist are used depending on the usage and application. For example, epoxy-based thermosetting resist inks are employed for industrial printed boards, whilst UV curable type resist inks are mainly employed for consumer printed boards. Recently, dry film type solder resists in the form of photosensitive films or liquid photosensitive solder resists capable of forming fine-line interconnections, are frequently employed. However, since thermal resistance on soldering, resistance to water-soluble fluxes, electrical insulating properties, tight bonding and excellent properties on PCT are demanded of the solder resist, epoxy resins such as novolak epoxy resins are contained as essential components in the solder resist. However, the thermal resistance on soldering, tight bonding, resistance to chemicals, etc. recently demanded of the solder resist, are not met with the customary epoxy resin. Besides, the photosensitive solder resist suffers from the problem that if the ratio of the epoxy resin is increased for improving the above-mentioned properties, the resulting composition is lowered in photocurability so that an unexposed portion is lowered in developing properties to render it impossible to form satisfactory resist patterns or to lead to inferior plating resistance. Besides, if the novolak epoxy resin is mixed into the solder resist, a cured film is inferior in flexibility. For these reasons, a demand is raised for an epoxy resin free of the above-mentioned drawbacks.

SUMMARY OF THE INVENTION

It is an object of the present invention to provide an epoxy resin composition which is excellent in reactivity, moisture proofness and workability.

It is another object of the present invention to provide an epoxy resin composition for encapsulation which is excellent in thermal resistance, moisture proofness, resistance to cracking, mechanical properties and electrical properties.

It is a further object of the present invention to provide an epoxy resin composition for a laminated plate which is excellent in thermal resistance, adhesiveness, moisture proofness, electrical properties, dielectric properties, dimensional stability and drilling properties.

It is yet another object of the present invention to provide an epoxy resin composition for a solder resist which is excellent in tight bonding, electrical insulating properties, resistance to electro-corrosion, thermal resistance on soldering, non-whitening against water-soluble fluxes for levellers, resistance to solvents, resistance to acids, resistance to alkalis, plating resistance and PCT properties.

The above and other objects of the present invention will become apparent from the following description.

In accordance with the present invention, there is provided an epoxy resin composition containing an epoxy resin represented by the formula (I), and a curing accelerator:

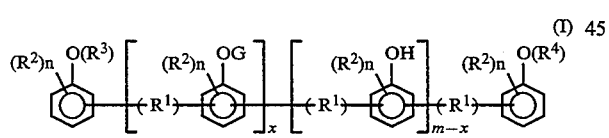

wherein $R^1$ stands for

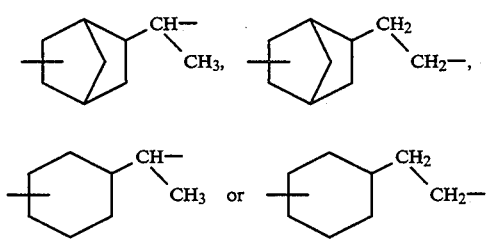

where G stands for a glycidyl group, $R^2$ stands for an alkyl group having 1 to 4 carbon atoms, $R^3$ and $R^4$ stand for the same or different groups and each denote a hydrogen atom or a glycidyl group, m and x each denote an integer of 0 to 10, n denotes an integer of 0 to 2, provided that $m \geq x$ and, if $m=0$, then $x=0$, in which case at least one of $R^3$ and $R^4$ denotes a glycidyl group on the condition that when $m \geq 1$ and $m > x$, $R^1$ may each stand for different groups.

In accordance with the present invention, there is also provided an epoxy resin composition for encapsulation containing the epoxy resin represented by the formula (I), a phenol resin, a curing accelerator and an inorganic filler.

In accordance with the present invention, there is also provided an epoxy resin composition for a laminated plate containing the epoxy resin represented by the formula (I), a curing agent, and a curing accelerator.

In accordance with the present invention, there is also provided an epoxy resin composition for a solder resist containing the epoxy resin represented by the formula (I), a curing accelerator and an inorganic filler.

PREFERRED EMBODIMENTS OF THE INVENTION

The present invention is explained hereinbelow in more detail.

The epoxy resin employed as an essential component in the epoxy resin composition of the present invention is an epoxy resin represented by the formula (I)

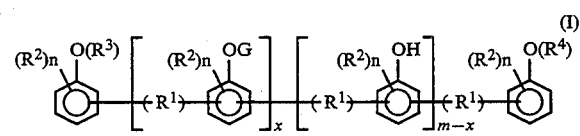

wherein $R^1$ stands for

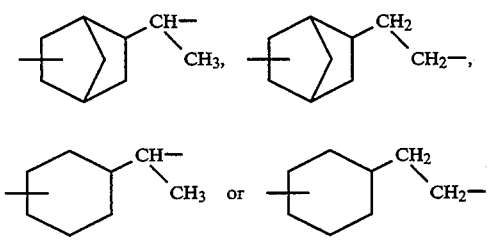

where G stands for a glycidyl group, $R^2$ stands for an alkyl group having 1 to 4 carbon atoms, $R^3$ and $R^4$ stand for the same or different groups and each denote a hydrogen atom or a glycidyl group, m and x each denote an integer of 0 to 10, n denotes an integer of 0 to 2, provided that $m \geq x$ and, if $m=0$, then $x=0$, in which case at least one of $R^3$ and $R^4$ denotes a glycidyl group on the condition that when $m \geq 1$ and $m > x$, $R^1$ may each stand for different groups. This epoxy resin is referred to hereinafter as epoxy resin (I).

With the epoxy resin (I), if the number of carbon atoms of $R^2$ is 5 or more, if m is 11 or more or if n is 3 or more, manufacture is rendered difficult. The number average molecular weight of the epoxy resin (I) may preferably be 400 to 3000 and more preferably 300 to 800.

The epoxy resin (I) may preferably be enumerated by compounds represented by the formulas:

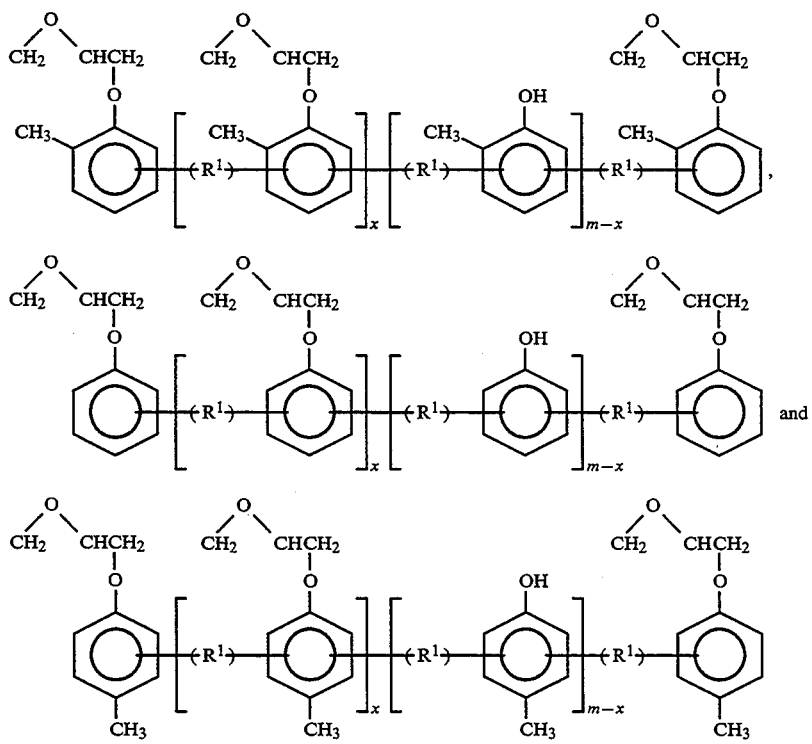

where $R^1$ has the same meaning as $R^1$ of the formula (I) and m and x stand for integers of 0 to 10, provided that $m \geq x$ and, when $m \geq 1$ and $m > x$, $R^1$ each may represent different groups.

For preparing the epoxy resin (I), a phenol resin obtained by reacting 4-vinylcyclohexene and/or 5-vinylnorbornene with a phenol represented by the formula (II)

where $R^2$ is an alkyl group having 1 to 4 carbon atoms and n is an integer of 0 to 2, in the presence of an acid catalyst, with a glycidylating agent such as epichlorohydrin or epibromohydrin.

4-vinylcyclohexene and 5-vinylnorbornene employed as starting components for the epoxy resin (I), are compounds which may be easily produced by Diels-Alder reaction between butadiene and cyclopentadiene. 4-vinylcyclohexene and 5-vinylnorbornene may be used singly. If used as a mixture, they may preferably be mixed within a range of 100:1 to 1:100 by weight.

The phenols of the formula (II) employed as another component of the epoxy resin (I) may preferably be enumerated by, for example, phenol, o-cresol, m-cresol, p-cresol, t-butylphenol, 2,6-dimethylphenol and 2,4-dimethylphenol. Phenols, cresols and xylenols, above all, are preferred in respect of ease with which the resin may be purified, and economic profitability.

The charging ratio of 4-vinylcyclohexene and/or 5-vinylnorbornene for reaction with phenols may preferably be 0.8 to 12 mol equivalents, more preferably 2 to 10 mol equivalents of phenols to 4-vinylcyclohexene and/or 5-vinylnorbornene. If the charging ratio of phenols is less than 0.8 mol equivalent, the epoxy resin (I) having a desired molecular weight cannot be produced, whereas if it exceeds 12 mol equivalents, a great deal of labor is undesirably consumed in removing non-reacted phenols.

As an acid catalyst employed in reacting 4-vinylcyclohexene and/or 5-vinylnorbornene with phenols, boron trifluoride; boron trifluoride complexes such as ether complexes, water complexes, amine complexes, phenol complexes or alcohol complexes of boron trifluoride; aluminum compounds such as aluminum trichlorides or diethyl aluminum monochloride; iron chloride; titanium tetrachloride; sulfuric acid; hydrogen fluoride; and trifluoromethane sulfonic acid may preferably be employed. In respect of activity and ease with which the catalysts may be removed, boron trifluoride, boron trifluoride-ether complexes, boron trifluoride-phenol complexes, boron trifluoride-water complexes, boron trifluoride-alcohol complexes and boron trifluoride-amine complexes are preferred, while boron trifluoride and boron trifluoride-phenol complexes are most preferred. Although the acid catalyst is used in differing amounts depending on the catalyst employed, boron trifluoride-phenol complexes, for example are used in an amount of preferably 0.1 to 20 parts by weight and more preferably 0.5 to 10 parts by weight to 100 parts by weight of 4-vinylcyclohexene and/or 5-vinylnorbornene.

The above reaction may be carried out in the presence or absence of solvents. If the solvent is not used, the phenols are charged in an amount in excess of an equivalent, above all, in an amount of 3 to 10 equivalents, to one mol of 4-vinylcyclohexene and/or 5-vinylnorbornene. There is no limitation to the types of the solvents employed if these do not impede the reaction. More concretely, the solvents may be preferably enumerated by aromatic hydrocarbon compounds such as benzene, toluene or xylene. Although the reaction temperature differs with the kinds of the acid catalysts employed, if boron trifluoride-phenol complex is used, the reaction temperature in the range of preferably 20° to 170° C. and more preferably 40° to 150° C. is employed. The reaction temperature in excess of 170° C. is not preferred because catalyst cracking or secondary reactions are produced, whereas if the reaction temperature is lower than 20° C., the reaction is retarded with economic demerits. If, for carrying out the above reaction, 4-vinylcyclohexene and/or 5-vinylnorbornene are added sequentially, it is possible to prevent homopolymerization of 4-vinylcyclohexene and/or 5-vinylnorbornene.

In the above reaction, a phenol resin, which is a precursor of the epoxy resin (I), may be obtained by filtering or deactivating the catalyst after the end of the reaction and concentrating the resulting solution. Although the method of catalyst removal differs with the types of the catalysts employed, if the catalyst is a boron trifluoride-phenol complex, it is preferred to add calcium hydroxide or magnesium hydroxide in an amount of 1 to 10 mols to 1 mol of the catalyst to inactivate the catalyst and subsequently to filter the catalyst. For filtration, the solvent may be added or the temperature of the filtrate may be increased for improving the workability.

The resulting phenol resin is glycidylated to produce the epoxy resin (I). The glycidylating reaction may be carried out by a known method of glycidylating the novolak phenol resin to give a novolak epoxy resin. More concretely, the phenol resin is reacted with glycidylating agents such as epichlorohydrin or epibromohydrin in the presence of sodium hydroxide or potassium hydroxide, after which the processes of washing with water and concentration are carried out. If the produced epoxy resin is used as an electronic material, by-produced sodium chloride need be removed completely by a water-washing step, as in the case of producing novolak epoxy resin or bisphenol A type epoxy resin.

The reaction between the phenol resin and the glycidylating agent is explained in more detail. For example, this reaction may be carried out by continuously adding an aqueous solution of an alkali such as sodium hydroxide to a mixture of the phenol resin and the glycidylating agent. The amount of the glycidylating agent with respect to the phenol resin may preferably be 2 to 20 mol equivalents and more preferably 3 to 7 mol equivalents to one mol of the phenol resin. If water is distilled off by azeotropic distillation with the glycidylating agent under a reduced pressure, the reaction proceeds more quickly. After the end of the reaction, by-produced sodium chloride and non-reacted alkalis are removed by washing with water. At this time, it is also possible to recover the glycidylating agent by distillation and concentrating the reaction solution and subsequently to dissolve the condensate in other solvents and to wash the resulting product with water. The solvents which may be employed include methyl isobutyl ketone, cyclohexane, benzene and butyl cellosolve. The epoxy resin (I) may be produced by concentration by heating after washing with water.

Although there is no limitation to the amount of the epoxy groups in the epoxy resin (I) which may be selected arbitrarily according to the usage and application, the epoxy equivalent may preferably be 230 to 470 mg per gram equivalent and more preferably 300 to 400 mg per gram equivalent. That is, the content of epoxy groups in the epoxy resin (I) may preferably be 50 to 100% based on the total weight of the phenol unit. In other words, it is preferred that x in the above formula (I) be 4 or more if m in the above formula (I) is equal to 10 and $R^3$ and $R^4$ are glycidyl groups. The content of the epoxy groups less than 230 mg, that is the content ratio less than 50%, is not desirable because the crosslinking density of the resulting cured resin product is lowered.

The curing accelerator employed as an essential component in the epoxy resin composition according to the present invention may be enumerated preferably by tertiary phosphines, imidazoles and tertiary amines. More concretely, the tertiary phosphines may be enumerated by phosphines represented by the formula (III)

where $R^5$, $R^6$ and $R^7$ are the same or different groups and denote a hydrogen atom, an alkyl group having 1 to 10 carbon atoms or an aryl group such as triethyl phosphine, tributyl phosphine or triphenyl phosphine.

The tertiary amines may be preferably enumerated by dimethylethanol amine, dimethylbenzyl amine, 2,4,6-tris(dimethylamino) phenol, and 1,8-diazabicyclo [5. 4. 0] undecene. The imidazoles may be enumerated by 2-ethyl-4-methyl imidazole, 2,4-dimethyl imidazole, 2-methyl imidazole, 2-undecyl imidazole, 2-heptadecyl imidazole, 1-vinyl-2-methyl imidazole, 1-propyl-2-methyl imidazole, 2-isopropyl imidazole, 1-cyanoethyl-2-ethyl imidazole, 1-cyanoethyl-2-ethyl-4-methyl imidazole, 1-cyanoethyl-2-undecyl imidazole, 1-cyanoethyl-2-phenyl imidazole, 2-phenyl imidazole, 1-benzyl-2-methyl imidazole, 2-phenyl-4-methyl imidazole, 2-phenyl-4,5-dihydroxymethyl imidazole and 2-phenyl-4-methyl-5-hydroxymethyl imidazole. Most preferred of these are 2-methyl imidazole, 1,8-diazabicyclo [5. 4. 0] undecene, triphenyl phosphine, dimethylbenzylamine and mixtures thereof.

The ratio of the epoxy resin (I) to the curing accelerator may preferably be 0.05 to 50 parts by weight and more preferably 0.5 to 10 parts by weight to 100 parts by weight of the epoxy resin (I).

In the epoxy resin composition of the present invention, epoxy resins other than the epoxy resin (I) may be employed as the epoxy resin component. Among these other epoxy resins, a novolak epoxy resin manufactured and sold by SUMITOMO CHEMICAL CO., LTD. under the trade name of "SUMIEPOXY ESCN-220L", a novolak epoxy resin manufactured and sold by YUKA SHELL EPOXY KK under the trade name of "EPIKOTE 180", a novolak epoxy resin manufactured and sold by DOW CHEMICAL CORPORATION under the trade name of "QUATREX 2410" and novolak epoxy resins manufactured and sold by TOTO KASEI KK under the trade names of "YDCN-702P" and "YDCN 703S", may be enumerated. An epoxy resin manufactured and sold by YUKA SHELL EPOXY KK under the trade name of "EPIKOTE 1001" and an epoxy resin manufactured and sold by YUKA SHELL EPOXY KK under the trade name of "YX-4000" may preferably be enumerated as a bisphenol A type epoxy resin and as a special epoxy resin, respectively. These other epoxy resins may be employed in an amount of 300 parts by weight or less and more preferably 100 parts by weight or less to 100 parts by weight of the epoxy resin (I).

The epoxy resin composition for encapsulation according to the present invention is characterized in that it contains the above-mentioned epoxy resin (I), a phenol resin, a curing accelerator and an inorganic filler, as essential components.

The epoxy resin (I) employed as an essential component in the epoxy resin composition for encapsulation according to the present invention is the above-mentioned epoxy resin represented by the formula (I).

Among the phenol resins employed as essential component in the epoxy resin composition for encapsulation according to the present invention, novolak phenol resins manufactured and sold by ARAKAWA KAGAKU KOGYO KK under the trade names of "TAMANOL 758" and "TAMANOL 759", a novolak epoxy resin manufactured and sold by CIBA-GEIGY AG under the trade name of "ECN-1280", a brominated novolak phenol resin, polyvinyl phenol, brominated polyvinyl phenol, and polyphenols, such as tetrabromo bisphenol A, may be preferably enumerated. Besides, copolymers of dicyclopentadiene and phenols and copolymers of 4-vinylcyclohexene and/or 5-vinylnorbornene as starting material of the epoxy resin (I) of the present invention with phenols may also be employed.

The curing accelerator employed as an essential component in the epoxy resin composition for encapsulation according to the present invention may preferably be those compounds enumerated as a component of the curing accelerator of the epoxy resin composition.

The inorganic filler component employed as an essential component in the epoxy resin composition for encapsulation according to the present invention may preferably be silica powder.

The proportions of the epoxy resin (I), the phenol resin, the curing accelerator and the inorganic filler may preferably be 20 to 180 parts by weight, more preferably 50 to 120 parts by weight of the phenol resin, 0.01 to 5.0 parts by weight, more preferably 0.5 to 3.0 parts by weight of the curing accelerator to 100 parts by weight of the epoxy resin (I), and 50 to 90% by weight, more preferably 65 to 85% by weight of the inorganic filler based on the total weight of the epoxy resin composition for encapsulation. If the proportion of the phenol resin is less than 20 parts by weight, curability is lowered, whereas if it exceeds 180 parts by weight, physical properties of the cured product such as hardness, moisture proofness, etc. are lowered. If the proportion of the curing accelerator is less than 0.01 part by weight, the composition is markedly lowered in curability, whereas if it exceeds 5.0 part by weight, the pot life of the epoxy resin composition for encapsulation becomes short to lower the workability. Besides, if the proportion of the inorganic filler is less than 50 wt. %, thermal resistance is lowered, whereas if it exceeds 90 wt. %, fluidity is lowered to render encapsulation difficult.

The epoxy resins other than the epoxy resin (I) may be used in addition to the epoxy resin (I). These other epoxy resins may be those enumerated in connection with the epoxy resin composition and may be used in amounts similar to those mentioned above.

In addition to the above-mentioned components, inflammation retarders such as silane coupling agents, bromated epoxy resins, antimony trioxide or hexabromobenzene, coloring agents such as carbon black or iron oxide red, mold release agents such as natural or synthetic wax, or various additives such as low-stress additives, such as silicone oil or rubber, may be added to the epoxy resin composition for encapsulation according to the present invention.

For producing the epoxy resin composition for encapsulation according to the present invention, the epoxy resin (I), the phenol resins the curing accelerator, the inorganic filler and if necessary, other components such as additives are uniformly mixed together by a mixer, melt-kneaded by a heated roll or a kneader and pulverized after cooling to form a molding material. The produced molding material is superior in mechanical and electrical properties, moisture proofness and resistance to cracking and may be used for encapsulation, coating or insulation of electronic or electric components.

The epoxy resin composition for a laminated plate according to the present invention is characterized in that it contains the epoxy resin (I), a curing agent and a curing accelerator as essential components.

The epoxy resin (I) employed as an essential component in the epoxy resin composition for a laminated plate according to the present invention is the epoxy resin (I) represented by the formula (I).

The curing agents employed in the epoxy resin composition for laminated plates according to the present invention may be well-known curing agents enumerated by, for example, dicyandiamide, aromatic amines, novolak phenols or acid anhydrides. These may be used singly or in combination. As for the curing accelerator employed for the epoxy resin composition for a laminated plate, the same curing accelerators enumerated as for the aforementioned epoxy resin composition may be used.

The proportions of the epoxy resin (I), the curing agent and the curing accelerator may preferably be 0.01 to 100 parts by weight and more preferably 0.5 to 50 parts by weight of the curing agent and 0.01 to 50 parts by weight and more preferably 0.05 to 10 parts by weight of the curing accelerator, to 100 parts by weight of the epoxy resin (I). If the proportion of the curing agent is less than 0.01 part by weight, curability is lowered, whereas if it exceeds 100 parts by weight, physical properties of the cured products such as hardness, moisture proofness, etc. are markedly lowered.

In the epoxy resin composition for laminated plate according to the present invention, the epoxy resins other than the epoxy resin (I) may be used in addition to the epoxy resin (I). These other epoxy resins may be those enumerated in connection with the aforementioned epoxy resin composition and may be used in amounts similar to those mentioned above.

Besides, in the epoxy resin composition for laminated plate according to the present invention, solvents commonly employed in the epoxy resin composition for laminated plate or additives such as fillers may be added in an amount which does not lead to lowered physical properties of the cured product. These solvents may preferably be enumerated by, for example methylethylketone, acetone, ethylene glycol monomethylether, dimethylformamide, xylene or toluene.

For producing a laminated plate using the epoxy resin composition for laminated plate according to the present invention, the epoxy resin (I), the curing agent, the curing accelerator and if need be, other components such as additives are mixed together, and subsequently the solvent is added for dissolution to produce a resin varnish, in a known manner per se. The produced resin varnish is adjusted so that the resin content is equal to a desired amount such as 50 wt %, and a glass cloth is immersed in the varnish for impregnation. The glass cloth is then dried by heating to produce a prepreg in the form of a B-stage. Plural prepregs are stacked and laminate molded so as to be pressed together under heating to produce a laminated plate having superior adhesiveness and workability. A metal foil such as a copper foil may be laminated during laminate molding, if so required.

The epoxy resin composition for solder resist according to the present invention is characterized in that it contains the epoxy resin (I), a curing accelerator and an inorganic filler as essential components.

The epoxy resin (I) employed as an essential component in the epoxy resin composition for solder resist according to the present invention is the epoxy resin (I) represented by the formula (I).

The curing accelerator employed as an essential component in the epoxy resin composition for solder resist according to the present invention may be any of those compounds enumerated above as the curing accelerator component of the above-mentioned epoxy resin composition.

The inorganic filler employed as an essential component in the epoxy resin composition for solder resist according to the present invention may preferably be enumerated by well-known inorganic fillers such as talc, quartz, alumina or barium sulfate.

The proportion of the curing accelerator may preferably be 0.1 to 10 parts by weight and more preferably 0.5 to 5 parts by weight to 100 parts by weight of the epoxy resin (I). If the proportion of the curing accelerator is less than 0.1 part by weight, the resulting epoxy resin composition is markedly lowered in curability, whereas if it exceeds 10 parts by weight, the pot life of the epoxy resin composition for solder resist becomes short to lower the workability.

The inorganic filler may preferably added in an amount of 5 to 30 wt % based on the total weight of the epoxy resin composition for solder resist excluding the weight of a solvent. If the amount of addition of the inorganic filler is less than 5 wt %, thermal resistance is lowered, whereas if it exceeds 30 wt %, encapsulation becomes difficult because of the lowered fluidity. Besides, various physical properties are also undesirably lowered.

In the epoxy resin composition for solder resist according to the present invention, the epoxy resins other than the epoxy resin (I) may be used in addition to the epoxy resin (I). These other epoxy resins may be those enumerated in connection with the epoxy resin composition and may be used in amounts similar to those mentioned above.

Besides, in the epoxy resin composition for solder resist according to the present invention, colored pigments such as Phthalocyanine Blue, Cyanine Blue or Hansa Yellow, various fluorescence dyestuffs or fine particles for controlling thixotropy such as aerosil may also be employed.

The epoxy resin composition for solder resist according to the present invention may be employed in the form of a thermosetting solder resist or a photosensitive solder resist. When the composition is used as the thermosetting solder resist, the above-mentioned components are mixed together. When the composition is used as the photosensitive solder resist, photosensitive resins, photopolymerization initiators and, if need be, photosensitive components containing photosensitive monomers, are mixed in addition to the above-mentioned components. The resulting composition is diluted in an organic solvent, mixed and kneaded together. The resulting solution is coated on a base material after adjusting the viscosity at ambient temperature. The viscosity may preferably be in a range of 1 to 500 poises, depending on the coating method employed. It may preferably be in a range of 1 to 100 poises in electrostatic coating and preferably in a range of 100 to 500 poises for screen printing or in curtain coating.

There is no limitation to the organic solvents employed if these may be commonly employed for a solder resist. These solvents may be enumerated by diacetone alcohol, ethyl cellosolve, butyl cellosolve, butyl cellosolve acetate, sulfite acetate, propylene glycol monomethyl acetate, diethylene glycol dimethyl ether and butyl carbitol.

The photosensitive resin employed as a photosensitive solder resist may preferably be enumerated by a (meth)acrylic acid adduct of the novolak type epoxy resin. An organic solvent may preferably be employed for development after exposure to light. If it is desirable to effect development by an alkaline solution, it is preferred to use a resin in which the (meth)acrylic acid adduct of the novolak type epoxy resin is reacted with $\alpha$, $\beta$-acid anhydride for half-esterification and then a carboxylic acid group is introduced. It is also possible to use the resin (I) in which the (meth)acrylic acid adduct of the epoxy resin (I) is reacted with $\alpha$, $\beta$-acid anhydride for half-esterification followed by introducing a carboxylic acid group. Besides, a photosensitive resin produced by reacting a maleic anhydride-olefin copolymer or a maleinated butadiene polymer with a photosensitive monomer containing photosensitive groups and hydroxyl groups such as hydroxyethyl (meth)acrylate may also be employed.

As the photosensitive monomers, photopolymerizable monomers known in the art such as 2-hydroxyethyl acrylate, 2-hydroxybutyl acrylate, trimethylolpropane triacrylate, pentaerythritol triacrylate, dipentaerythritol hexaacrylate, 2-hydroxyethyl methacrylate, trimethylolpropane trimethacrylate or pentaerythritol trimethacrylate, may preferably be employed. Preferably, the photosensitive monomer may be added in an amount which is in a range of 0 to 20 wt % and which does not afford tackiness to the coating film.

The photopolymerization initiators well-known in the art such as, for example benzoin, benzoin methyl ether, benzil, Michler's ketone or diethyl thioxanthone, are preferably employed. Marketed photopolymerization initiators such as those manufactured and sold by CIBA-GEIGY AG under the trade names of "IRGACURE 184", "IRGACURE 651" and "IRGACURE 907" and those manufactured and sold by MERK and CO., INC. under the trade name of "DAROCURE 1173", may also be employed. The photopolymerization initiators may preferably be employed in an amount of 1 to 15 wt % based on the weight of the photosensitive component. If the amount is less than 1 wt %, the photosensitive film is lowered in photocurability, whereas if it exceeds 15 wt %, the photosensitive coating film is undesirably lowered in strength.

When the epoxy resin composition for solder resist according to the present invention is used as a photosensitive solder resist, the total amount of addition of the photosensitive component may preferably be 20 to 60 wt % based on the total weight of the epoxy resin composition for solder resist less the solvent.

When a solution having dissolved therein the epoxy resin composition for solder resist is coated on a base material, a fine pattern is first formed by a screen printing method, etc. in the case of the thermosetting type solder resist. In the case of the photosensitive solder resist, the above-mentioned solution is usually coated on the entire surface of a base plate by screen printing, spray coating or curtain coating before drying the coating film. After drying, the coated base plate is irradiated with ultraviolet rays using e.g. a mercury lamp, xenone lamp or metal halide lamp and developed with an organic solvent or an aqueous solution of an alkali for removing an undeveloped portion to produce a fine pattern. The base plate having a fine pattern thus obtained is post-cured to use same. The coating film in the photosensitive solder resist is preferably dried by hot air drying or using far infrared rays at 120° C. or lower, preferably in a range of from 60° to 100° C. for 10 to 60 minutes. Since the temperature and time differ with the types of the solvents employed, the dilution ratio or the thickness of the coating film, it is necessary to select and set an optimum condition. If the curing temperature exceeds 120° C., the thermosetting reaction is initiated so that the fine pattern undesirably cannot be produced after exposure to light and development. The post-curing may be carried out by hot air drying or using far infrared rays at a curing temperature of preferably 120° to 180° C. preferably for 10 to 60 minutes. If the curing temperature is lower than 120° C. or the curing time is less than 10 minutes, sufficient physical properties of the coating film cannot be produced, whereas if the curing temperature exceeds 180° C. or the curing time exceeds 60 minutes, the physical properties of the coating film are undesirably deteriorated. Meanwhile, the photosensitive solder resist may be used after thermal curing instead of light irradiation without any inconveniences.

Since the epoxy resin having good molecular weight equilibrium and content of the epoxy groups is used in the epoxy resin composition of the present invention, the composition is superior in moisture proofness and long-term durability and exhibits most desirable properties for encapsulation, for a laminated plate or for a solder resist.

Besides, the epoxy resin composition for encapsulation according to the present invention gives a cured product having excellent moisture proofness, high glass transition temperature Tg and a low melt viscosity, so that it is superior in workability and the amount of addition of the inorganic filler may be increased. Consequently, a semiconductor package cured from the epoxy resin composition for encapsulation according to the present invention is superior in thermal resistance, such that even when the semiconductor package undergoes severe temperature changes at the time of soldering of a lead wire, no cracks are produced in resin molded parts, so that the interface between the resin and the lead wires is not deteriorated.

Besides, the epoxy resin composition for laminated plate according to the present invention is superior in thermal resistance, adhesiveness and moisture proofness. Consequently, the composition is not subject to a Measling phenomenon otherwise caused by heating by far infrared rays, infrared rays or soldering or to interphase peeling. In addition, the composition is subject to less warping and excellent in dimensional stability and reliability in through-hole adhesion, while being superior in drilling performance. On the other hand, a laminated plate having excellent electrical properties may be produced with the epoxy resin composition, which also exhibits dielectric properties suited to a printed circuit board for high-speed electronic equipment or high frequency equipment.

The epoxy resin composition for solder resist according to the present invention is also excellent in tight bonding, electrical insulating properties, resistance to electro-corrosion, thermal resistance on soldering, non-whitening properties against a water-soluble flux for leveller, resistance to solvents such as methylene chloride, resistance to acid and alkali, plating resistance and PCT properties.

The above-described epoxy resin composition according to the present invention uses a particular epoxy resin excellent in reactivity, hydrophobic properties, workability and economic profitability as an essential component. In addition, the composition may be employed for powder paints.

EXAMPLES OF THE INVENTION

The present invention is hereinafter explained with reference to Examples and Comparative Examples. These Examples, however, are given only for the sake of illustration and by no means intended for limiting the scope of the invention.

Synthesis Example 1

1489 g of o-cresol and 300 g of toluene were charged to a 5-liter reactor equipped with a reflux cooler and a Liebich condenser and heated to 170° C. for distilling 250 g of toluene and for dehydration until the moisture in the system amounted to 50 ppm. After cooling the system to 80° C., and adding 38 g of boron trifluoride-phenol complex to the system, 383 g of 4-vinylcyclohexene having a moisture content of 20 ppm were added gradually dropwise over 1.5 hours while the reaction temperature was controlled to 80° C. After the end of dropwise addition, the reaction was continued at 80° C. for 40 minutes, after which the temperature was raised to 140° C. and agitation was carried out under heating for 2.5 hours. After the end of the reaction, 80 g of a magnesium compound manufactured and sold by KYOWA KAGAKU KOGYO KK under the trade name of "KW-1000" were added and agitated for 60 minutes for deactivating the catalyst. The reaction solution was then filtered using a filter paper on which sellaite was laid. The transparent filtrate produced in this manner was distilled in vacuum at 230° C. to produce 550 g of a copolymer.

The produced copolymer had a softening point of 104° C. The equivalent of phenolic hydroxy groups, as found from the content of the phenolic hydroxyl groups found by back titration after acetylation with acetic anhydride was 195.

288 g of the produced copolymer and 700 g of epichlorohydrin were charged into a four-neck flask having a capacity of 3 liters and fitted with an agitator, a reflux cooler and a thermometer, and agitated for dissolution. The reaction system was adjusted to a pressure of 150 mmHg and the temperature in the system was raised to 70° C. Reaction was carried out for 3.5 hours while 113 g of a 48 wt % aqueous solution of sodium hydroxide was continuously added to the system. Water generated by the reaction and water of the aqueous solution of sodium hydroxide were azeotropically removed from the system continuously with epichlorohydrin. After the end of the reaction, the reaction system was reset to the atmospheric pressure, and the temperature was raised to 110° C. for complete water removal from the reaction system. After distilling off excess epichlorohydrin under atmospheric pressure, distillation was continued at 140° C. under a vacuum of 15 mmHg to produce a mixture of the resin and sodium chloride.

400 g of methylisobutyl ketone and 36 g of a 10 wt % aqueous solution of sodium hydroxide were added to the resulting mixture of the resin and sodium chloride and reaction was carried out at 85° C. for 1.5 hours. After the end of the reaction, 550 g of methyl isobutyl ketone and 300 g of water were added and an underlayer of the aqueous solution of sodium hydroxide was separated and removed. 150 g of water were added to a methylisobutyl ketone layer for washing. After neutralization with phosphoric acid, the water layer was separated and the resulting product was washed with 200 g of water. The water layer was separated. After distillation of the methylisobutyl ketone layer under atmospheric pressure, distillation under vacuum was carried out at 5 mmHg and at 140° C. to produce 305 g of an epoxy resin, referred to hereinafter as epoxy resin (I-1). The epoxy equivalent and the softening point of the produced epoxy resin were 260° and 60° C., respectively. By measurement of the IR spectrum of the produced epoxy resin, specific absorption of the epoxy resin was found at 3050 cm$^{-1}$, 3040 cm$^{-1}$, 3000 cm$^{-1}$ and 1250 cm$^{-1}$, while specific absorption of an aromatic ring was found at 1600 cm$^{-1}$ and 1500 cm$^{-1}$.

Synthesis Example 2

The reaction was carried out in the same way as in Synthesis Example 1, except using 1600 g of phenol in place of o-cresol and using 370 g of 5-vinylnorbornene in place of 4-vinylcyclohexene. 555 g of a copolymer product was obtained.

The produced copolymer had a softening point of 100° C. and a phenolic hydroxy group equivalent of 192.

Using 297 g of the produced copolymer, glycidylation was carried out in the same way as in Synthetic Example 1. 310 g of an epoxy resin having an epoxy equivalent of 273 and a softening point of 72° C., referred to hereinafter as epoxy resin (I-2), was produced.

Example 1

73 g of the epoxy resin (I-1) produced in Synthesis Example 1, 27 g of a novolak phenol resin manufactured and sold by ARAKAWA KAGAKU KK under the trade name of "TAMANOL 759", 235 g of fused silica powders manufactured by TATSUMORI KK under the trade name of "FUSELEX RD-8", and predetermined amounts of various additives shown in Table 1, were mixed together and kneaded by a kneader to produce an epoxy resin molding material.

The produced molding material was tabletted and, using the tabletted molding material, a test piece was encapsulated by a low pressure transfer molding machine under conditions of 175° C., 70 kg/cm$^2$ and 120 sec. The resulting product was post-cured at 180° C. for five hours. For testing soldering cracking, a chip 6×6 mm was encapsulated in a 52 pin package, while for testing moisture proofness on soldering, a chip 3×6 mm was encapsulated in a 16 pin SOP package. The encapsulated test pieces are put to the following tests for soldering cracking and tests for moisture proofness on soldering. Test results are shown in Table 1.

Tests on soldering cracking: The encapsulated test piece was processed under an environment of 85° C. and 85% relative humidity for 48 hours and 72 hours and subsequently immersed in a soldering bath of 280° C. for 10 seconds. Cracks formed on the outer side of the test piece were observed by a microscope.

Mean service life of moisture proofness on soldering: The encapsulated test piece was processed under an environment of 85° C. and 85% relative humidity for 48 hours and 72 hours and subsequently immersed in a soldering tank of 280° C. for 10 seconds. The test piece was then put to a pressure cooker test at 125° C. in 100% relative humidity and the time which elapsed until 50% circuit opening troubles occurred was measured.

Example 2

Test pieces were encapsulated in the same way as in Example 1, except using the epoxy resin (I-2) obtained in Synthesis Example 2, and put to the tests. Test results are shown in Table 1.

Comparative Example 1

Test pieces were encapsulated in the same way as in Example 1 except using 67 g of a novolak epoxy resin manufactured and sold by SUMITOMO CHEMICAL CO., LTD. under the trade name of "SUMIEPOXY ESCN-220L" in place of the epoxy resin used in Example 1, and using 33 g of a novolak phenol resin manufactured and sold by ARAKAWA KAGAKU KK under the trade name of "TAMANOL 759", and were put to the test. Test results are shown in Table 1.

TABLE 1

|  | Ex.1 | Ex.2 | Comp. Ex. 1 |
|---|---|---|---|
| Composition |  |  |  |
| Novolak Phenol Resin (g) | 27 | 28 | 33 |
| Novolak Epoxy Resin (g) | — | — | 67 |
| Epoxy Resin (I-1) (g) | 73 | — | — |
| Epoxy Resin (I-2) (g) | — | 72 | — |
| Triphenyl Phosphine (g) | 0.2 | 0.2 | 0.2 |
| Carnauba Wax (g) | 0.5 | 0.5 | 0.5 |
| Antimony Trioxide (g) | 8 | 8 | 8 |
| Carbon Black (g) | 0.5 | 0.5 | 0.5 |
| Coupling Agent (g) | 0.5 | 0.5 | 0.5 |
| Fused Silica Powders (g) | 235 | 235 | 235 |
| Properties |  |  |  |
| Spiral Fluidity (cm) | 78 | 85 | 80 |
| Glass Transition Point (Tg) (°C.) | 147 | 148 | 160 |
| Bending Elastic Modulus (kg/mm$^2$) | 1160 | 1130 | 1400 |
| Mean Life of Humidity Resistance (hrs.) | 300< | 300< | 100 |
| Soldering Cracking Test (number of cracks/total number) | 0/16 | 0/16 | 16/16 |

Coupling Agent: γ-glucidoxy Propyl Trimethoxysilane
Spiral Fluidity: EMMI-1-66 method
Tg: TMA method
Bending Elastic Modulus: JIS-K-6911

Examples 3 to 8 and Comparative Examples 2 to 4

Each of glass cloths was immersed in each epoxy resin varnish obtained by mixing an epoxy resin, a curing agent, a curing accelerator and a solvent (resin content, 60 wt %) shown in Table 2 for impregnation with the varnish. Each of the produced varnish-impregnated cloths was dried for 4 minutes in a drying chamber maintained at 160° C. to produce a prepreg in the form of a B-stage.

Eight of the produced prepregs were stacked and two electrolytic copper foils each 35 μm thick were stacked on both sides of the stacked prepregs. The resulting product was heated at 175° C. for 120 minutes under pressure application at 40 kg/cm$^2$ to produce laminated plates. The physical properties of each produced cured laminated plate are shown in Table 2. It is seen from the results shown in Table 2 that the laminated plates produced using the epoxy resin composition for laminated plate according to the present invention exhibit superior thermal resistance, moisture proofness and dielectric properties.

TABLE 2

|  |  | Ex.3 | Ex.4 | Ex.5 | Ex.6 | Ex.7 | Ex.8 | Comp. Ex. 2 | Comp. Ex. 3 | Comp. Ex. 4 |
|---|---|---|---|---|---|---|---|---|---|---|
| Composition (parts by Weight) | Epoxy Resin | | | | | | | | | |
| | Epoxy Resin (I-1) | 100 | | 100 | | | | | | |
| | Epoxy Resin (I-2) | | 100 | | 100 | 100 | 90 | | | |
| | EPIKOTE 1001 *1 | | | | | | | 100 | | |
| | EPIKOTE 180 *2 | | | | | | 10 | | 100 | |
| | EPIKOTE 5046 *3 | | | | | | | | | 100 |
| | (Curing Agents) | | | | | | | | | |
| | Dicyandiamide | 3.3 | 3.3 | | | | 3.3 | 3.3 | 3.3 | 3.3 |
| | Phenol Novolak | | | 38 | | | | | | |
| | Diamino Diphenyl Methane | | | | 10 | | | | | |
| | Methyl Tetrahydro phthalic Anhydride | | | | | 33 | | | | |
| | (Curing Accelerator) | | | | | | | | | |
| | 2-Ethyl-4-methyl Imidazole | 0.21 | 0.21 | 0.21 | 0.1 | 1 | 0.21 | 0.21 | 0.21 | 0.21 |
| | (Solvents) | | | | | | | | | |
| | Methyl Ethyl Ketone | 30 | 30 | 40 | 70 | 80 | 30 | 30 | 30 | 40 |
| | Methyl Cellosolve | 30 | 30 | 40 | | | 30 | 30 | 30 | 40 |
| | Dimethyl Formamide | 10 | 10 | | | | 10 | 10 | 10 | |
| Curing Conditions | Temperature (°C.) | 175 | 175 | 175 | 175 | 175 | 175 | 175 | 175 | 175 |
| | Time (h) | 2 | 2 | 2 | 2 | 2 | 2 | 2 | 2 | 2 |
| Curing properties | Glass Transition Temperature (°C.) 1) | 160 | 165 | 168 | 150 | 156 | 171 | 130 | 163 | 142 |
| | Water Absorption (wt. %) 2) | 1.4 | 1.4 | 0.9 | 1.2 | 1.7 | 1.5 | 2.1 | 2.8 | 2.0 |
| | Peeling Strength (kgf/cm) 3) | 1.8 | 1.9 | 1.6 | 1.8 | 1.9 | 1.9 | 1.9 | 2.0 | 1.9 |
| | Dielectric Constant (1 MHZ) 4) | 4.1 | 4.1 | 3.9 | 4.0 | 4.3 | 4.2 | 4.9 | 4.8 | 4.9 |
| | Dielectric Tangent (MHz) | 0.012 | 0.012 | 0.008 | 0.009 | 0.011 | 0.012 | 0.018 | 0.017 | 0.018 |

Note: Molding Conditions: 175° C., 120 min., 40 kg/cm$^2$
Curing Properties:
1) Glass Transition Temperature measured by DSC
2) Water Absorption (according to JIS-C-6481) measured by measuring weight gain after boiling in water at 100° C. for 50 hours
3) Peeling Strength (according to JIS-C-6481)
4) Dielectric Constant and Dielectric Tangent (according to JIS-C-6481)
*1 EPIKOTE 1001; manufactured by YUKA SHELL EPOXY KK, Bisphenol A type Epoxy Resin, Epoxy Equivalent 470
*2 EPIKOTE 180; manufactured by YUKA SHELL EPOXY KK, Cresol Novolak type Epoxy Resin, Epoxy Equivalent 210
*3 EPIKOTE 5046; manufactured by YUKA SHELL EPOXY KK, Brominated Bisphenol A type Epoxy Resin, Epoxy Equivalent 475

Synthesis Example 3

1091 g of a cresol novolak epoxy resin manufactured by TOTO KASEI KK under a trade name of "YDCN-702" (epoxy equivalent, 218) were charged into a four-necked separable flask having a capacity of 3 liters and equipped with a stirrer and a reflux cooling pipe, and were heated under agitation for melting. 397 g of acrylic acid, 0.8 g of hydroquinone and 7.0 g of benzyl-methyl amine were added to the reaction system. After raising the temperature to 115° C. and reaction under agitation for 12 hours, the reaction system was cooled to room temperature to produce an acrylate of the novolak epoxy resin. The acid value of the acrylate of the novolak epoxy resin was 4.5 mgKOH/g. 450 g of the acrylate of the novolak epoxy resin and 250 g of propylene glycol monomethyl ether acetate were charged into a 2-lit. four-necked separable flask and heated to 80° C. for melting. 120 g of phthalic anhydride were added to the reaction mass which was heated to 100° C. and reacted for 8 hours. The acid value of a solid content of an acid anhydride adduct of the acrylate of the novolak epoxy resin was 84 mgKOH/g.

Synthesis Example 4

258 g of a liquid butadiene polymer, which was produced by polymerizing butadiene in the presence of toluene as a chain transfer agent, using benzyl sodium as a catalyst, and which had a number average molecular weight of 1000 and a viscosity at 25° C. of 13 poises and contained 65% of 1, 2 linkages, 194 g of maleic anhydride, 10 g of triethylene glycol dimethyl ether and 2 g of trimethyl hydroquione, were charged into a 1 lit. separable flask fitted with a reflux cooling tube and a nitrogen blowing pipe, and reaction was carried out under a nitrogen stream at 190° C. for five hours. After the end of the reaction, non-reacted maleic anhydride and triethylene glycol dimethyl ether were distilled off to produce 441 g of a maleinated butadiene polymer having a total acid value of 480 mgKOH/g.

300 g of the produced maleinated butadiene polymer and 189 g of diethylene glycol dimethyl ether were charged into a 2-lit. separable flask fitted with a reflux cooling pipe, and the temperature was raised to 125° C. for melting. After melting, the reaction mass was cooled to 65° C. and admixed with 149.0 g of 2-hydroxyethyl acrylate and 0.6 g of hydroquinone and subsequently with 3 g of triethyl amine to carry out the reaction. The reaction was carried out for three hours while the reaction temperature, which was raised due to the heat of reaction by addition of triethyl amine, was controlled to be equal to 85° C. A 70 wt % solution of 2-hydroxyethyl acrylate of a maleinated butadiene polymer in diethyleneglycol dimethyl ether was produced.

Examples 9, 10 and Comparative Example 5

The main compositions 1 to 4 having the compositions shown in Table 3 were prepared using a three-roll system.

TABLE 3

| Composition of Main Component | Main Component 1 | Main Component 2 |
|---|---|---|
| Photosensitive Oligomer | | |
| Acrylate of Synthesis Example 3 1) | 57.7 | — |
| Acrylate of Synthesis Example 4 2) | — | 57.7 |
| Photosensitive Monomer | 6.1 | 6.1 |
| Dipentaerythritol Hexaacrylate (DPHA) | | |
| Photopolymerization Initiator, Sensitizer | | |
| Irgacure 907 3) | 3.3 | 3.3 |
| DETX 4) | 1.0 | 1.0 |
| Curing Agent | 2.4 | 2.4 |
| 2 PHz 5) | | |
| Filler | 25.1 | 25.1 |
| Barium Sulfate | | |
| Colored Pigment | 1.1 | 1.1 |
| Phthalocyamine Green | | |
| Leveling Agent | 2.4 | 2.4 |
| Modaflow 6) | | |
| Defoaming Agent | 0.9 | 0.9 |
| TSA-750S 7) | | |

1) 70% solution of acid anhydride adduct of novolak epoxy resin from Synthesis Example 3 esterified by acrylic acid
2) 70% solution of a half ester of maleinated butadiene polymer from Synthesis Example 4 with 2-hydroxyethyl methacrylate
3) 2-methyl-1-[4-(methylthio)phenyl]-2-morpholino-propan-1-on, manufactured by CIBA-GEIGY AG
4) 2,4-diethyl thio xanthone manufactured by NIPPON KAYAKU KK
5) Manufactured by SHIKOKU CHEMICALS CO., LTD.
6) Manufactured by MONSANTO COMPANY
7) Silicone-base defoaming agent manufactured by TOSHIBA SILICONE KK 35 g of epoxy resin solutions 1, 2 or 3 shown in Table 4 were added and mixed to 100 g of each of the main compositions to produce photosensitive and thermosetting resin compositions.

TABLE 4

| | Epoxy Resin Solution | | |
|---|---|---|---|
| | Solution 1 | Solution 2 | Solution 3 |
| Epoxy Resin (I-1) | 70 g | — | — |
| Epoxy Resin (I-2) | — | 70g | — |
| Novolak Epoxy Resin 1) | — | — | 70 g |
| Propylene Glycol Monomethyl Acetate | 30 g | 30 g | 30 g |

1) Manufactured by TOTO KASEI KK under trade name of "YDCN 702"

Each of the photosensitive thermosetting resin compositions was coated by the screen printing method on the entire surface of each printed circuit board of glass-/epoxy resin to have a dry thickness of 20 μm and dried by a hot air drier at 75° C. for 30 minutes. A negative pattern photomask was tightly contacted with the dried coating film and exposed to light at 500 mJ/cm² by a metal halide lamp light exposure device manufactured by ORC MANUFACTURING CO., LTD. Then, using a 1% aqueous solution of sodium carbonate at 30° C., the coating film was developed at a spray pressure of 2 kg/cm². After washing with water and drying at 75° C. for 30 minutes, thermosetting reaction was carried out for 30 minutes in a hot-air circulating oven maintained at 150° C. Certain physical properties were measured of the produced cured products of the photosensitive and thermosetting resin compositions. The results are shown in Table 5.

TABLE 5

| | Ex.9 | Ex.10 | Comp. Ex. 5 |
|---|---|---|---|
| Composition: | | | |
| Main Component | Main Component 1 | Main Component 2 | Main Component 1 |
| Epoxy Resin | Solvent 1 | Solvent 2 | Solvent 3 |
| Properties: | | | |
| Photocurability (step) | 12 | 13 | 11 |
| Resolution (μm) | 60 | 40 | 60 |
| Tight Bonding | ⊚ | ⊚ | ○ |
| Pencil Hardness | 6 H | 6 H | 6 H |
| Thermal Resistance (Sec) | 140 | 120 | 120 |
| Leveller Whitening | ○ | ○ | Δ |
| Peeling | ⊚ | ⊚ | Δ |
| Resistance to Methylene Chloride | | | |
| Swelling (min) | 60 | 90< | 60 |
| Time until cross-cuts become visible (min) | 45 | 60 | 60 |
| Resistance to Hydrochloric Acid | | | |
| Whitening | ○ | ○ | ○ |
| Peeling | ⊚ | ⊚ | Δ |
| Resistance to Sulfuric Acid | | | |
| Whitening | ⊚ | ⊚ | ○ |
| Peeling | ⊚ | ⊚ | ⊚ |
| Resistance to NAOH | | | |
| Whitening | ○ | ○ | ○ |
| Peeling | ⊚ | ⊚ | ⊚ |
| Resistance to Plating | | | |
| Ni | ⊚ | ⊚ | Δ |
| Au | ⊚ | ⊚ | x |
| Resistance to PCT | Accepted | Accepted | Accepted |
| Electrical Insulating Properties | $10^{14}<$ | $10^{14}<$ | $10^{14}<$ |
| Electrolytic Corrosion IPC | | | |
| Condition 1 | Accepted | Accepted | Accepted |
| Condition 2 | Accepted | Accepted | Accepted |
| Condition 3 | Accepted | Accepted | Accepted |

The following are the testing methods and the criteria of evaluation and judgement.

1) Developing properties (not shown in Table)

The photosensitive and thermosetting resin compositions were coated on each epoxy substrate to give a dry film thickness of approximately 20 μm by the screen printing method. After drying for 30 minutes at 75° C., a photomask was intimately applied to a coating film surface and exposed to light at 500 mJ/cm² using the metal halide lamp light exposure device manufactured by ORC MANUFACTURING CO., LTD. The coating film was developed under a spray pressure of 2 kg/cm$^2$, using a 1% aqueous solution of sodium carbonate. The state of the developed film after washing with water spray and drying was visually checked as to if the portion irradiated with light remained undeveloped or if no ink was left in the non-irradiated portion. The compositions of the Examples 9 and 10 exhibited good developing properties.

2) Photocurability and Resolution

A photosensitive thermosetting resin composition was coated on an epoxy substrate to have a thickness equal to two cellophane tapes. After drying at 75° C. for 30 minutes, a step tablet manufactured by STOUFFER Inc. and a test pattern No.1 for measuring the resolution manufactured by HITACHI CHEMICAL CO., LTD. were contacted with the coating film surface and the coating film was exposed to light at 500 mJ/cm$^2$ using the metal halide lamp light exposure device manufactured by ORC MANUFACTURING CO., LTD. The coating film was developed for one minute at a spray pressure of 2 kg/cm$^2$, using a 1% aqueous solution of sodium carbonate, washed with water spray and dried. The dried product was heat-set for 30 minutes in a hot air circulating oven.

The number of remnant patern steps were read by a step tablet manufactured by STOUFFER Inc. so as to be used as measures for photocurability. A larger number of the steps was accepted as indicating a higher rate of the photocuring reaction. The resolution was also evaluated using the test pattern No.1 for resolution measurement manufactured by HITACHI CHEMICAL CO., LTD.

3) Tight Bonding Properties

An ink of a photosensitive thermosetting resin composition was coated on an epoxy substrate to have a dry film thickness of approximately 20 μm by screen printing. After drying at 75° C. for 30 minutes, a photomask was applied to the coating film surface and the coating film was exposed to light at 500 mJ/cm$^2$, using a metal halide lamp light exposure device manufactured by ORC MANUFACTURING CO., LTD. The coating film was then developed for one minute under a spray pressure of 2 kg/cm$^2$, using a 1% aqueous solution of sodium carbonate, washed with water spray and dried. The dried mass was then heat cured for 30 minutes in a hot air circulating oven at 150° C.

The cured coating film on the copper foil was cross-cut in a checkerboard pattern with 100 squares each sized 1 mm×1 mm. A cellophane tape was bonded on the cross-cut coating film and peeled off and the peeling state was checked by visual inspection.

⊚; none was peeled off (100/100).
○; the cross-cut portion were slightly peeled off (100/100).
Δ; the tape was left at 99 to 50 squares (99/100 to 50/100).
x; the tape was left at 40 to 0 squares (49/100 to 0/100).

4) Pencil Hardness Test

Hardness of the cured coating film on the copper foil was measured in accordance with the testing method of JIS K 5400.

5) Thermal Resistance

The cured coating film was coated with a flux manufactured by ASAHI CHEMICAL RESEARCH LABORATORY under the trade name of ASAHISPIDY-FLUX AGF-J31 and placed stationarily on a solder bath maintained at 260° C. After soldering, the coating film was checked as to possible abnormalities. If there were no abnormalities, such as peeling or swelling of the coating film or the solder intruding into a space below the coating film, the flux was again applied and, after soldering at 260° C. for 15 seconds, the coating film was again observed visually. The time which elapsed until unusualties are produced in the coating film was adopted as a measure of the heat-resistant time.

6) Resistance Against Water-Soluble Flux for Leveller

The cured coating film was coated with a water-soluble flux for leveller, manufactured by MERCK INC. under the trade name of "W-139". The coated film was immersed in a soldering bath at 260° C. for 15 seconds and immediately dipped into lukewarm water of 70° to 80°. After allowing to stand for one hour, the coating film was washed with water and dried to check if any abnormalities such as swelling, peeling or whitening were produced in the coating film.

As for whitening, the following evaluation was made.
○; no whitening occurred.
Δ; whitening occurred to a lesser extent.
x; whitening occurred.

A peeling test was then carried out by applying a cellophane tape on the coating film and peeling off the tape, and evaluation was made in the following manner. The same evaluation was used for the peeling tests which followed.
⊚; no peeling.
○; peeling occurred only slightly.
Δ; peeling occurred severely.
x; the coating film was peeled off in its entirety.

7) Resistance to Methylene Chloride

The cured coating film was immersed in methylene chloride at room temperature and taken out at intervals of 15 minutes to check to see if swelling occurred in the coating film or cross-cuts of the glass substrate were still visible and the time which elapsed until defects occurred was measured.

8) Resistance to Acid and Alkali

The cured coating film was immersed in a 10 vol. % aqueous solution of hydrochloric acid, a 20 vol. % aqueous solution of sulfuric acid and a 5 wt. % aqueous solution of caustic soda, each for three hours, at room temperature, and surface whitening and tight bonding of the coating film were checked. The tight bonding of the coating film was evaluated by the peeling test.

9) Resistance to Plating

A test substrate pre-treated by a non-electrolytic nickel plating with a pre-treatment solution for non-electrolytic nickel plating manufactured by OKUNO CHEMICAL INDUSTRIES CO., LTD., was plated by non-electrolytic nickel plating, followed by non-electrolytic gold plating, and put to a peeling test by using a cellophane tape to check for the peeling state.
⊚; no peeling
○; peeling occurred slightly
Δ; peeling occurred severely
x; the coating film was peeled off in its entirety.

10) PCT (pressure cooker test) Performance

The coating film was allowed to stand at 121° C. for five hours in a vapor at 121° C. under 2 atm. for five hours and checked if abnormalities such as swelling, peeling or discoloration occurred in the coating film.

11) Electric Insulating Properties and Resistance to Electro-corrosion

The electric insulating properties were checked in accordance with JIS C-6481, while resistance to electro-corrosion was checked in accordance with IPC SM-840. Meanwhile, IPC provides the following three different conditions as the test conditions, and evaluation was made as to if these conditions were met.

Condition 1; temperature of 35°±5° C. humidity of 90% and four testing days

Condition 2; temperature of 50°±5° C. humidity of 90% and seven testing days

Condition 3; two cycles of temperature of 25°±2° C. to 65° C.±2° C., humidity of 90% and four testing days.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. An epoxy resin composition for encapsulation containing an epoxy resin represented by the formula (I), a phenol resin, a curing accelerator and an inorganic filler:

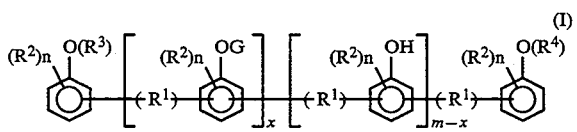

(I)

wherein $R^1$ stands for

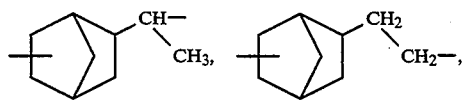

-continued

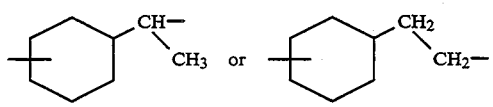

where G stands for a glycidyl group, $R^2$ stands for an alkyl group having 1 to 4 carbon atoms, $R^3$ and $R^4$ stand for the same or different groups and each denote a hydrogen atom or a glycidyl group, m and x each denote an integer of 0 to 10, n denotes an integer of 0 to 2, provided that $m \geq x$ and, if $m=0$, then $x=0$, in which case at least one of $R^3$ and $R^4$ denotes a glycidyl group on the condition that when $m \geq 1$ and $m > x$, $R^1$ may each stand for different groups.

2. The composition as defined in claim 1 wherein the phenol resin is selected from the group consisting of novolak phenol resin, brominated novolak phenol resin, polyvinyl phenol, bromated polyvinyl phenol, tetrabromobisphenol A, dicyclopentadiene-phenol copolymers, 4-vinylcyclohexene-phenol copolymers, 5-vinylcyclohexene-phenol copolymers, 4-vinylcyclohexene-5-vinylcyclohexene-phenol copolymers and mixtures thereof.

3. The composition as defined in claim 1 wherein the inorganic filler is silica powder.

4. The composition as defined in claim 1 containing 20 to 180 parts by weight of phenol resin and 0.01 to 5.0 parts by weight of the curing accelerator to 100 parts by weight of the epoxy resin represented by the formula (I), and 50 to 90 wt % of the inorganic filler based on total weight of the composition.

5. The composition as defined in claim 1 wherein a number average molecular weight of the epoxy resin represented by the formula (I) is 400 to 3000.

6. The composition as defined in claim 1 wherein the epoxy resin represented by the formula (I) is selected from the group consisting of the compounds represented by the following formula and mixtures thereof:

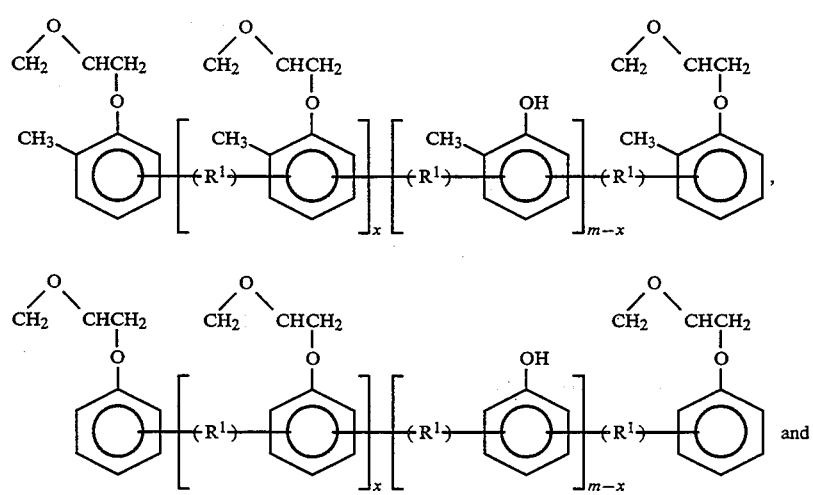

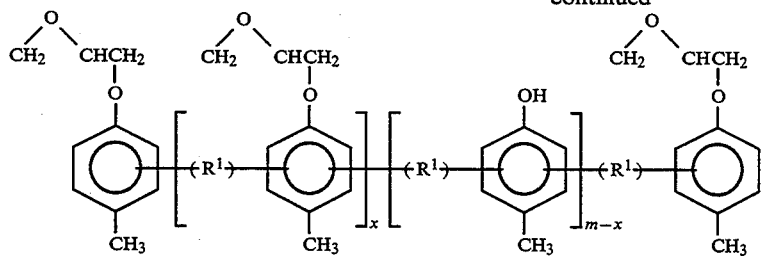

where R[1] stands for

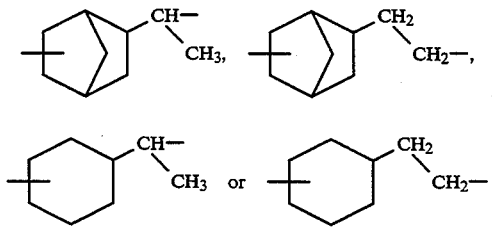

where m and x denote integers of 0 to 10, provided that m≧x and, when m≧1 and m>x, R[1] may each represent different groups.

7. The composition as defined in claim 1 wherein the epoxy resin represented by the formula (I) is produced by reacting a compound selected from the group consisting of 4-vinylcyclohexene, 5-vinylnorbornene and mixtures thereof with a phenol represented by the formula (II)

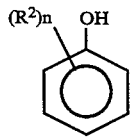

where $R^2$ represents an alkyl group having 1 to 4 carbon atoms, and n represents an integer of 0 to 2, in the presence of an acid catalyst to produce a phenol resin, and by reacting the produced phenol resin with a glycidylating agent.

8. The composition as defined in claim 1 wherein the epoxy resin represented by the formula (I) has an epoxy equivalent of 230 to 470 mg per gram equivalent.

9. The composition as defined in claim 1 wherein the curing accelerator is selected from the group consisting of tertiary phosphines, imidazoles, tertiary amines other than imidazoles and mixtures thereof.

10. The composition as defined in claim 9 wherein the tertiary phosphines are selected from the group consisting of triethyl phosphine, tributyl phosphine, triphenyl phosphine, and mixtures thereof.

11. The composition as defined in claim 9 wherein the tertiary amines are selected from the group consisting of dimethylethanol amine, dimethylbenzyl amine, 2,4,6-tris (dimethylamino) phenol, 1,8-diazabicyclo [5,4,0] undecene and mixtures thereof.

12. The composition as defined in claim 9 wherein the imidazoles are selected from the group consisting of 2-ethyl-4-methyl imidazole, 2,4-dimethyl imidazole, 2-methyl imidazole, 2-undecyl imidazole, 2-heptadecyl imidazole, 1-vinyl-2-methyl imidazole, 1-propyl-2-methyl imidazole, 2-isopropyl imidazole, 1-cyanoethyl-2-ethyl imidazole, 1-cyanoethyl-2-ethyl-4-methyl imidazole, 1-cyanoethyl-2-undecyl imidazole, 1-cyanoethyl-2-phenyl imidazole, imidazole, 2-phenyl imidazole, 1-benzyl-2-methyl imidazole, 2-phenyl-4-methyl imidazole, 2-phenyl-4-methyl-5-hydroxymethyl imidazole, and mixtures thereof.

* * * * *